(12) United States Patent
Sadovnikov et al.

(10) Patent No.: US 12,113,128 B2
(45) Date of Patent: Oct. 8, 2024

(54) DMOS TRANSISTOR HAVING THICK GATE OXIDE AND STI AND METHOD OF FABRICATING

(71) Applicant: TEXAS INSTRUMENTS INCORPORATED, Dallas, TX (US)

(72) Inventors: Alexei Sadovnikov, Sunnyvale, CA (US); Natalia Lavrovskaya, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 151 days.

(21) Appl. No.: 17/330,095

(22) Filed: May 25, 2021

(65) Prior Publication Data

US 2021/0280714 A1 Sep. 9, 2021

Related U.S. Application Data

(62) Division of application No. 16/179,445, filed on Nov. 2, 2018, now Pat. No. 11,049,967.

(51) Int. Cl.
*H01L 29/78* (2006.01)
*H01L 21/28* (2006.01)
(Continued)

(52) U.S. Cl.
CPC .... *H01L 29/7816* (2013.01); *H01L 21/28123* (2013.01); *H01L 29/0653* (2013.01);
(Continued)

(58) Field of Classification Search
CPC ........... H01L 29/66681; H01L 29/0847; H01L 29/7835; H01L 29/7816; H01L 29/0692; H01L 29/402; H01L 29/0653; H01L 21/28123; H01L 29/7831; H01L 29/66659; H01L 29/4238; H01L 21/28052; H01L 29/4933; H01L 21/28211; H01L 29/1045; H01L 29/42368; H01L 29/7817; H01L 27/1203; H01L 21/84; H01L 29/1083; H01L 29/404; H01L 29/7824; H01L 29/063; H01L 21/823892; H01L 21/761; H01L 29/1095; H01L 29/0878;
(Continued)

(56) References Cited

U.S. PATENT DOCUMENTS

| | | | | |
|---|---|---|---|---|
| 5,472,887 A | * | 12/1995 | Hutter | H01L 27/088 257/E27.06 |
| 5,489,547 A | * | 2/1996 | Erdeljac | H01L 21/32155 257/363 |
| 6,268,633 B1 | * | 7/2001 | Pio | H10B 41/40 257/501 |
| 6,313,509 B1 | * | 11/2001 | Iwasa | H01L 27/0266 361/91.1 |

(Continued)

*Primary Examiner* — Mouloucoulaye Inoussa
(74) *Attorney, Agent, or Firm* — Ronald O. Neerings; Frank D. Cimino

(57) ABSTRACT

An integrated circuit chip and a method of fabricating the IC chip to include a transistor having a thick gate oxide in combination with STI. The method provides a wafer for which a source region location, a drain contact region location, an extended drain region location and a gate region location have been defined and forms an STI structure overlying the extended drain region location. After growing a gate oxide layer over the gate region location and a portion of the extended drain region location, the method forms a gate structure on the gate oxide layer, the gate structure having a gap overlying the intersection of an edge of the STI structure with the gate oxide layer.

29 Claims, 17 Drawing Sheets

(51) Int. Cl.
*H01L 29/06* (2006.01)
*H01L 29/423* (2006.01)
*H01L 29/66* (2006.01)

(52) U.S. Cl.
CPC .... *H01L 29/4238* (2013.01); *H01L 29/66681* (2013.01); *H01L 21/28052* (2013.01); *H01L 21/28211* (2013.01)

(58) Field of Classification Search
CPC . H01L 29/7823; H01L 29/36; H01L 27/0727; H01L 27/0255; H01L 29/0623; H01L 29/0619; H01L 29/0649; H01L 21/76202; H03K 19/018507; H03K 17/063; H02M 3/156
USPC ....... 257/335, 365, 339, 183, 357, 355, 173, 257/546, 360, 391, 501, 413, 412, 384, 257/238, 358, 380, 381, E29.264, 257/E29.256, E21.001, E29.001, E27.016, 257/E21.623, E21.625, E29.133; 438/286, 294, 480, 763, 981, 776, 306, 438/307, 529, 528, 275, 233, 231, 532, 438/228, 217, 385, 934, 220
See application file for complete search history.

(56) References Cited

U.S. PATENT DOCUMENTS

| | | | |
|---|---|---|---|
| 6,368,922 B1* | 4/2002 | Yu | H01L 27/0266 438/307 |
| 2003/0027396 A1* | 2/2003 | Imam | H01L 29/0634 438/528 |
| 2007/0057321 A1 | 3/2007 | Kikuchi et al. | |
| 2008/0308874 A1 | 12/2008 | Letavic et al. | |
| 2010/0102388 A1* | 4/2010 | Levin | H01L 21/823814 257/E29.256 |
| 2010/0283098 A1 | 11/2010 | Yoshida et al. | |
| 2010/0320544 A1 | 12/2010 | Tseng et al. | |
| 2012/0037984 A1* | 2/2012 | Yu | H01L 29/7835 257/E29.261 |
| 2013/0270635 A1 | 10/2013 | Parris et al. | |
| 2014/0001549 A1* | 1/2014 | Bode | H01L 29/7835 438/478 |
| 2015/0137260 A1* | 5/2015 | Matsui | H03K 17/687 257/390 |
| 2018/0026134 A1* | 1/2018 | Eikyu | H01L 29/4238 257/330 |
| 2018/0219533 A1* | 8/2018 | Khayat | H03K 19/018507 |
| 2019/0148517 A1* | 5/2019 | Edwards | H01L 21/266 257/288 |

* cited by examiner

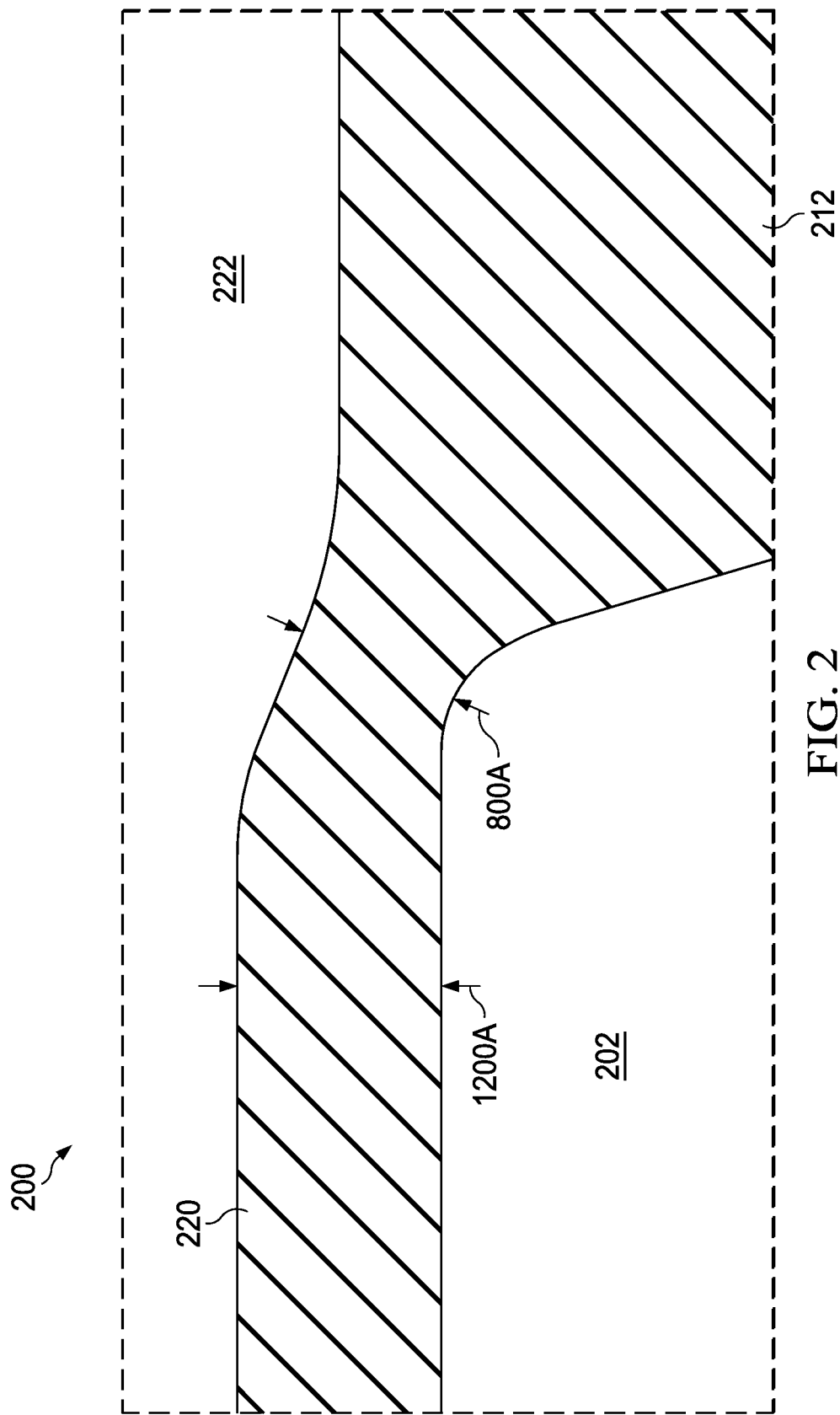

900D

946 — DOPE THE EXTENDED DRAIN REGION

948 — IMPLANT DOPANTS IN THE SOURCE REGION AND THE DRAIN CONTACT REGION

950 — DEPOSIT A SECOND DIELECTRIC LAYER OVERLYING THE SURFACE OF THE WAFER

FIG. 9F

DMOS TRANSISTOR HAVING THICK GATE OXIDE AND STI AND METHOD OF FABRICATING

CROSS REFERENCE TO RELATED APPLICATIONS

This application is a divisional of U.S. patent application Ser. No. 16/179,445, issued as U.S. Pat. No. 11,049,967 B2, which is incorporated herein by reference in its entirety.

FIELD OF THE DISCLOSURE

Disclosed embodiments relate generally to the field of semiconductor processing. More particularly, and not by way of any limitation, the present disclosure is directed to a Double-Diffused Metal Oxide Silicon (DMOS) transistor having a thick gate oxide and Shallow Trench Isolation (STI) and a method of fabricating.

BACKGROUND

The source and drain moats in a medium-voltage DMOS transistor, e.g., 30-200V, are usually separated by STI. The depth of the STI is set by the Complementary Metal Oxide Silicon (CMOS) process. However, STI is not utilized if a thick gate oxide is required to hold a high gate voltage, e.g., 48V, since the thickness of a High-Voltage Gate OXide (HVGOX) next to the STI corner will be much thinner, causing low breakdown voltage and poor gate reliability. On the other hand, a DMOS transistor having HVGOX extended to the drain moat will have a low breakdown voltage when the transistor is turned on (BVdii) and a poor Safe Operating Area (SOA) due to a smaller than desirable thickness of the HVGOX next to the drain moat. Increasing the thickness of the HVGOX results in undesirable higher values for the threshold voltage (Vth), the body coefficient, and the specific on-resistance (Rsp).

SUMMARY

Disclosed embodiments combine a thick gate oxide, which is also referred to herein as a high-voltage gate oxide (HVGOX), and STI, then etch a gap in the gate structure overlying the intersection of the thick gate oxide with the edge of the STI where the gate oxide is the thinnest. The gap, which can then be filled with a dielectric material, can significantly reduce the maximum electric field in the oxide and may provide one or more advantages such as increased breakdown voltage, improved gate oxide reliability and reduced gate capacitance. The size of the gap can be varied to provide a balance between the maximum electric field (Emax) in the gate oxide and the specific on-resistance (Rsp) of the transistor.

In one aspect, an embodiment of a method of fabricating an integrated circuit (IC) chip containing a transistor having a thick gate oxide in combination with STI is disclosed The method includes providing a wafer for which a source region location, a drain contact region location, an extended drain region location and a gate region location have been defined; forming a shallow trench isolation (STI) structure overlying the extended drain region location; growing a gate oxide layer over the gate region location and a portion of the extended drain region location; and forming a gate structure on the gate oxide layer, the gate structure having a gap overlying an intersection of the gate oxide layer with an edge of the STI structure.

In another aspect, an embodiment of an IC chip having a DMOS transistor is disclosed. The DMOS transistor includes a source region having a first dopant type; an extended drain region coupled to a drain contact region, the extended drain region and the drain contact region having the first dopant type; a gate region having a second dopant type that is opposite the first dopant type; an STI structure overlying the extended drain region; a gate oxide layer overlying the gate region and a portion of the extended drain region; and a gate structure on the gate oxide layer, the gate structure having a gap overlying an intersection of the gate oxide layer with an edge of the STI structure.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 2 depicts a cross-section of the intersection of an edge of the STI with a thick gate oxide when grown according to the prior art;

FIGS. 9A-9F depict further elements of a flowchart for fabricating a DMOS transistor according to an embodiment of the disclosure.

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

For purposes of the present application, a "thick" gate oxide is defined as a gate oxide that has a thickness between 5 percent and 50 percent of the thickness of the STI used in the fabrication process. In one embodiment, a thick gate oxide has a thickness that is at least 10 percent of the thickness of the STI. In the example disclosed in FIG. 1, the gate oxide has a thickness that is 25 percent of the thickness of the STI layer. Similarly, references to an HVGOX refer to a gate oxide that has a thickness between 5 percent and 50 percent of the thickness of the STI.

Figure 1A:
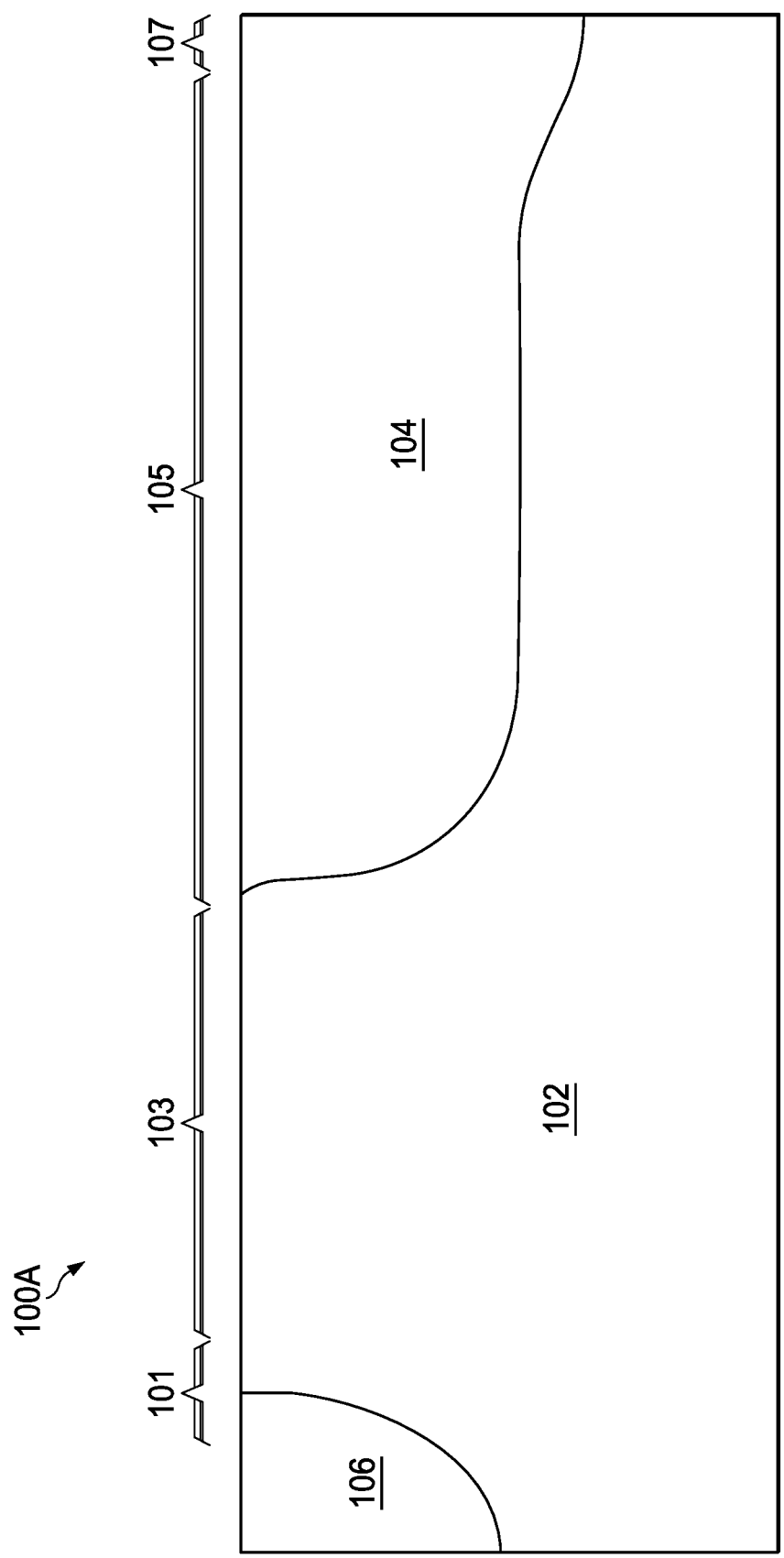
FIGS. 1A-1G depict cross-sectional diagrams of an example IC chip containing a DMOS transistor during different phases of fabrication according to an embodiment of the disclosure.

FIGS. 1A through 1G depict various stages in the fabrication of a DMOS transistor according to an embodiment of the disclosure. FIG. 1A depicts a portion of a wafer 100A on which a DMOS transistor is being fabricated. In one embodiment, the substrate 102 of wafer 100A can comprise a conventional single crystal substrate or a silicon-on-insulator (SOI) substrate. The substrate 102 can further be a p-type substrate or an n-type substrate having a p-epitaxial layer thereon. Locations for four regions of the DMOS transistor have been defined: a source region location 101, a gate region location 103, an extended drain region location 105 and a drain contact region location 107. As the disclosed process begins, the embodiment shown in FIG. 1A contains an N-type drift region 104 that has already been formed and an N-well 106, although it is also possible for drift region 104 to be formed at a later stage of the fabrication. It should be noted that semiconductor regions such as N-type drift region 104 are shown in outline only; these semiconductor regions may have doping variations that are not relevant to the present disclosure and are not explicitly shown.

Figure 1B:
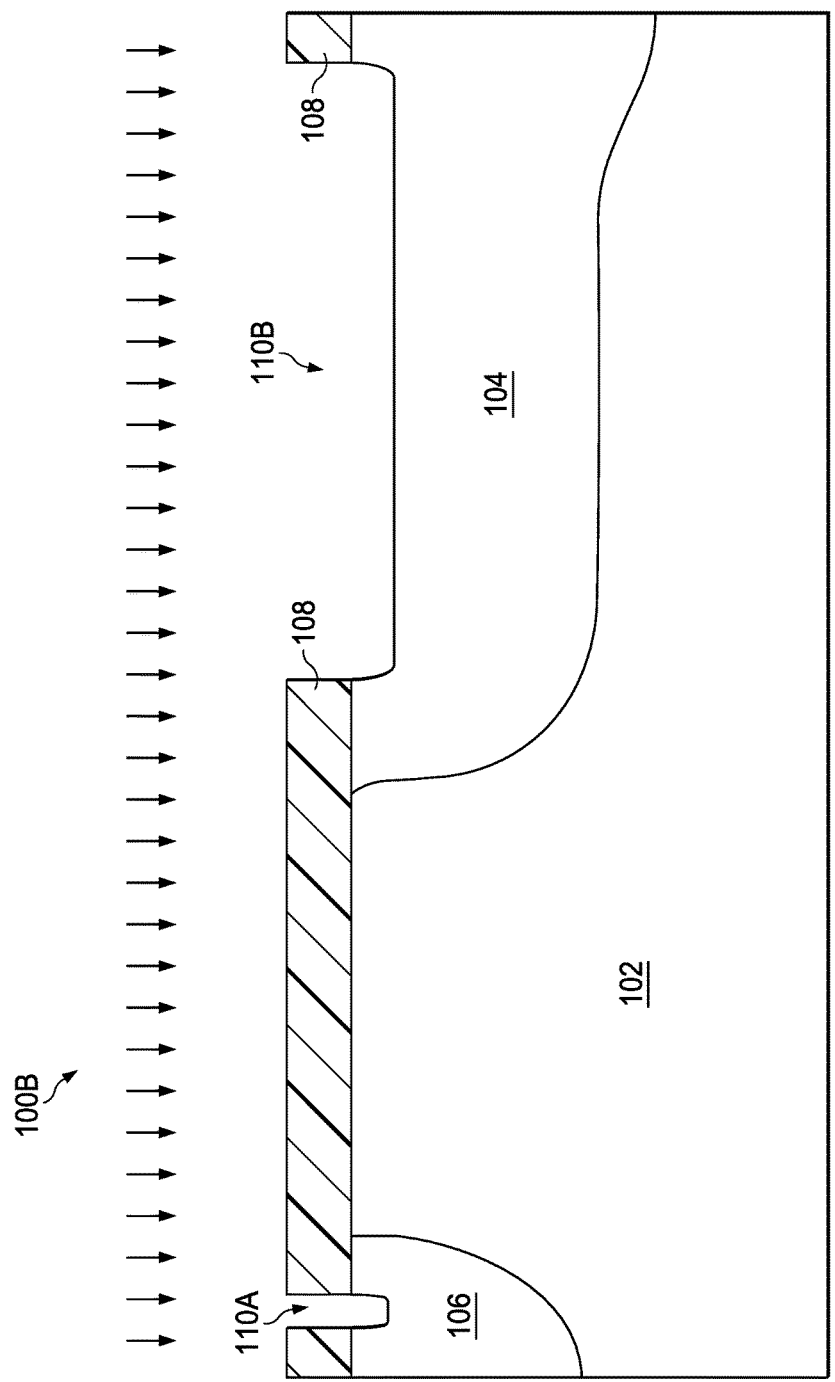
Figure 1C:
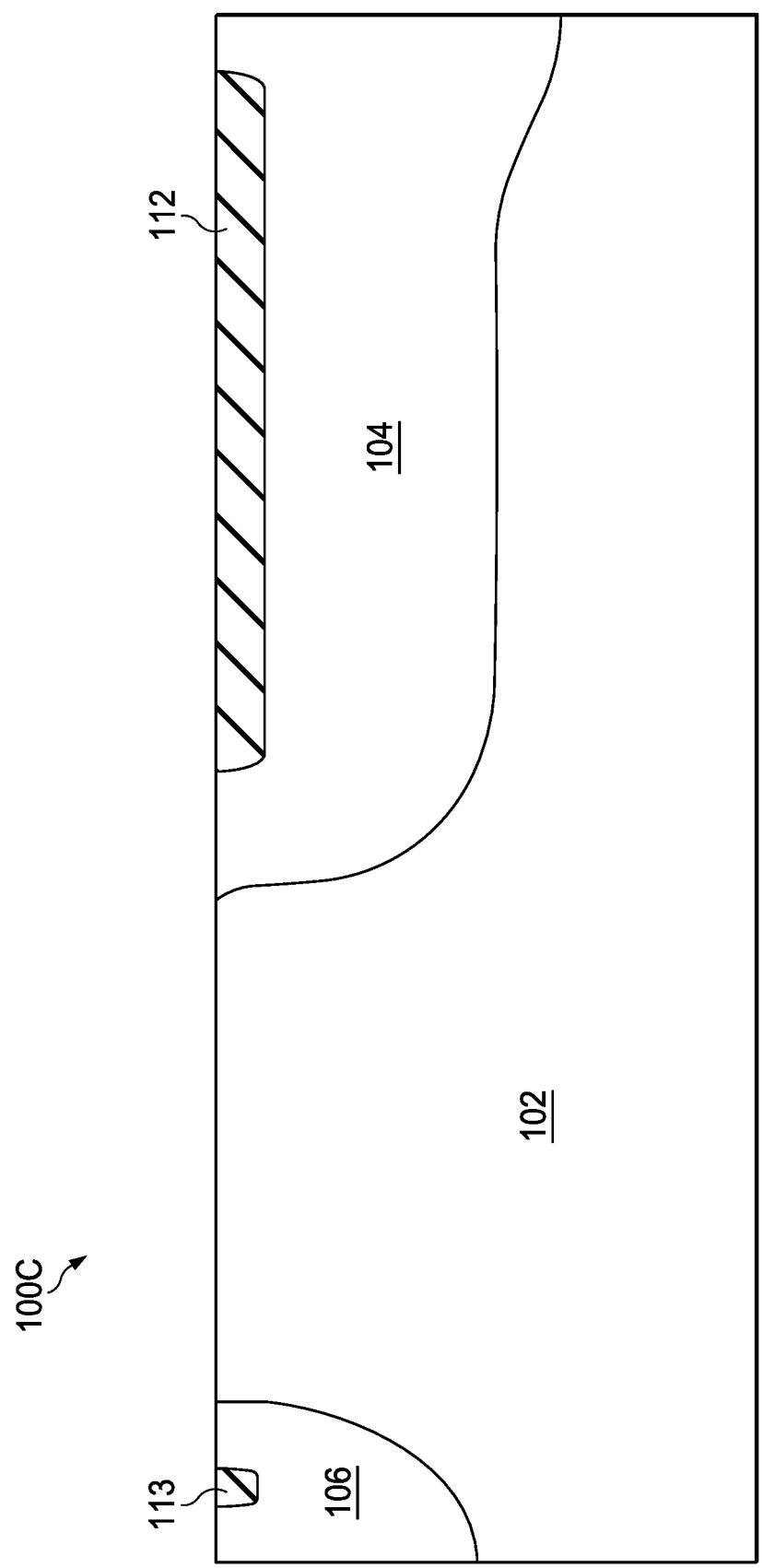

FIG. 1B depicts the process of creating shallow trenches to assist in providing isolation between different elements of the wafer. A thin oxide layer (not specifically shown) can be thermally grown on the surface of the wafer and a photoresist layer 108 deposited and patterned to expose those regions in which trench isolation, such as STI, is desired. The exposed regions of wafer 100B are etched to create shallow trenches 110A, 110B. In particular, shallow trench 110B overlies the drift region 104 of the transistor being fabricated. In this specific embodiment, shallow trench 110A is used to separate the source region from a contact to the base region that will be formed at a later time; formation of shallow trench 110A may not be necessary in other embodiments. Once the shallow trenches are created, photoresist layer 108 is removed.

Following removal of photoresist layer 108, a layer of dielectric material is deposited on the surface of wafer 100C, which fills the shallow trenches 110A, 110B and covers the surface of the wafer. The surface of wafer 100C is then planarized to remove excess material, e.g., the dielectric lying outside the shallow trenches 110. The planarization can be performed using a process such as Chemical-Mechanical Polishing (CMP) and results in the cross-section of wafer 100C seen in FIG. 1C, which now contains STI 112, 113.

Figure 1D:
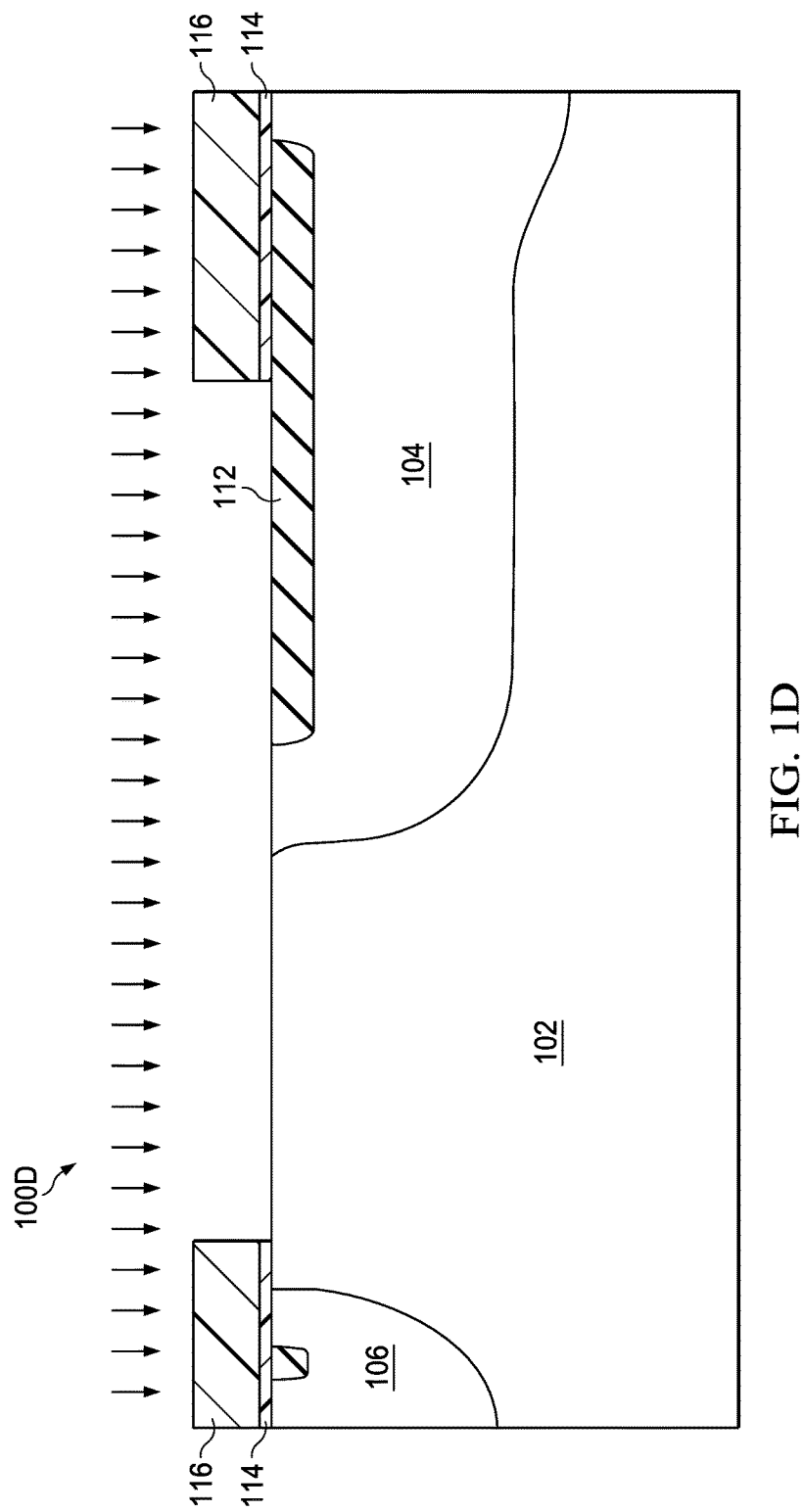

Next, the gate oxide will be grown overlying the gate region and part of the STI and drift region. In one embodiment the gate oxide is grown using a process known as LOCal Oxidation of Silicon (LOCOS). For LOCOS processing a thin silicon oxide layer (not specifically shown) is thermally grown on the wafer surface; this layer is generally called a pad oxide. A layer of silicon nitride 114 is then deposited on wafer 100D using, in one embodiment, Low Pressure Chemical Vapor Deposition (LPCVD) to deposit a layer of silicon nitride about 100 nm to 200 nm thick; this layer of silicon nitride 114 is used as an oxygen barrier during oxidation. The silicon nitride 114 is patterned using a layer of photoresist 116 and the lithography pattern is then etched into the silicon nitride 114. The result is a silicon nitride hard mask, which has openings that define the active areas defined by the LOCOS process, as shown in FIG. 1D.

Figure 1E:
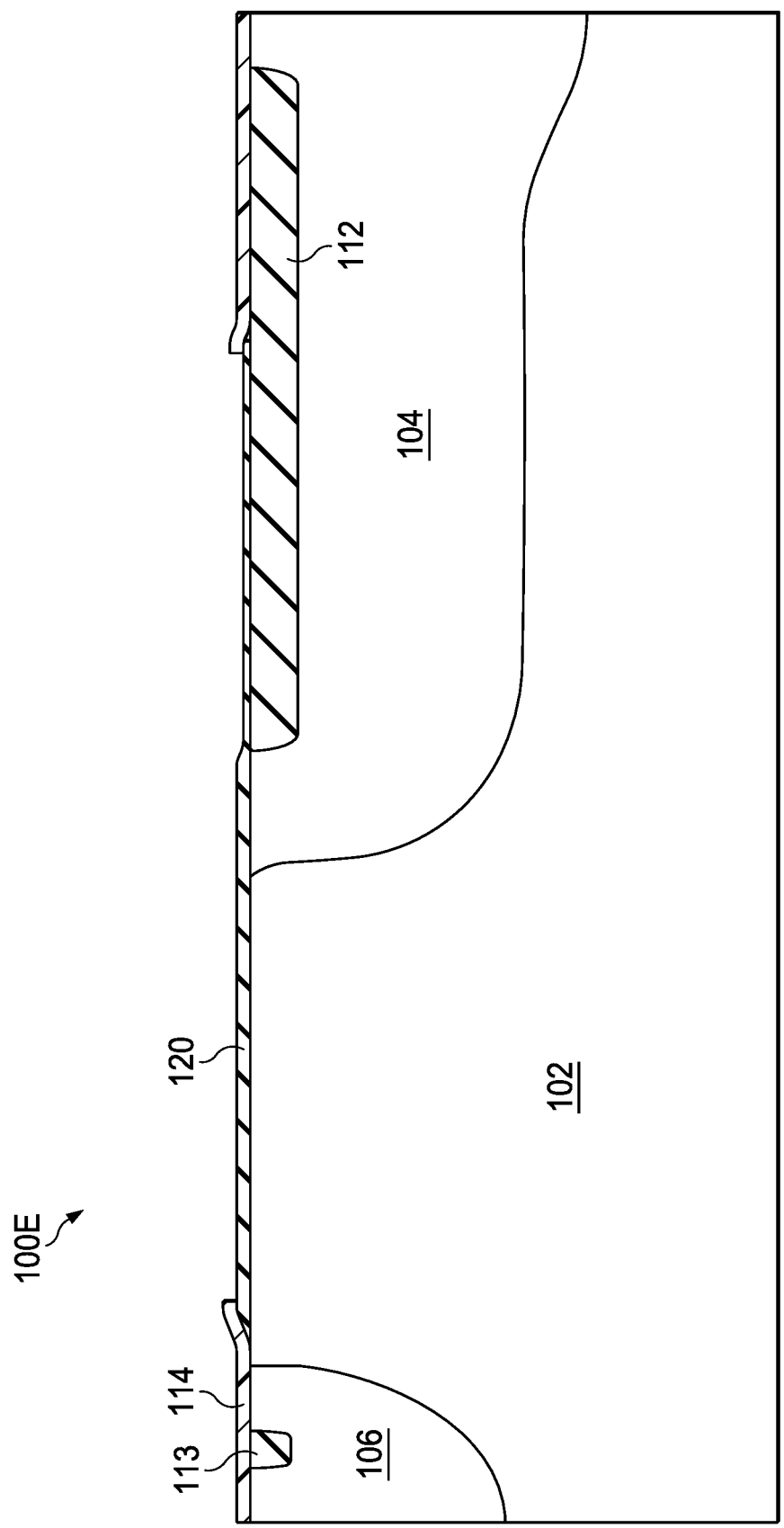

FIG. 1E depicts the wafer 100E after formation of the gate oxide 120, e.g., by LOCOS. The LOCOS process is generally a thermal steam oxidation process at temperatures above 950 degree C. to allow stress-relief by viscous flow of the LOCOS oxide. A wet LOCOS process has faster throughput than a dry oxide process and is of generally good quality. LOCOS regions such as gate oxide 120 have the known distinctive 'bird's beak' along their periphery. The bird's beak results because as the silicon oxide grows, the silicon nitride hard mask, which is used to block the silicon oxide from growing everywhere, is slightly bent due to stress caused by the growing silicon oxide pushing the silicon nitride 114 as it grows. Additionally, as can be seen in this figure, gate oxide 120 is thicker in regions where the gate oxide 120 overlies silicon and is thinner in areas where the gate oxide 120 overlies STI 112. This is due to the physics of oxide growth in that less oxygen is able to penetrate the STI region in order to combine with silicon.

Figure 1F:
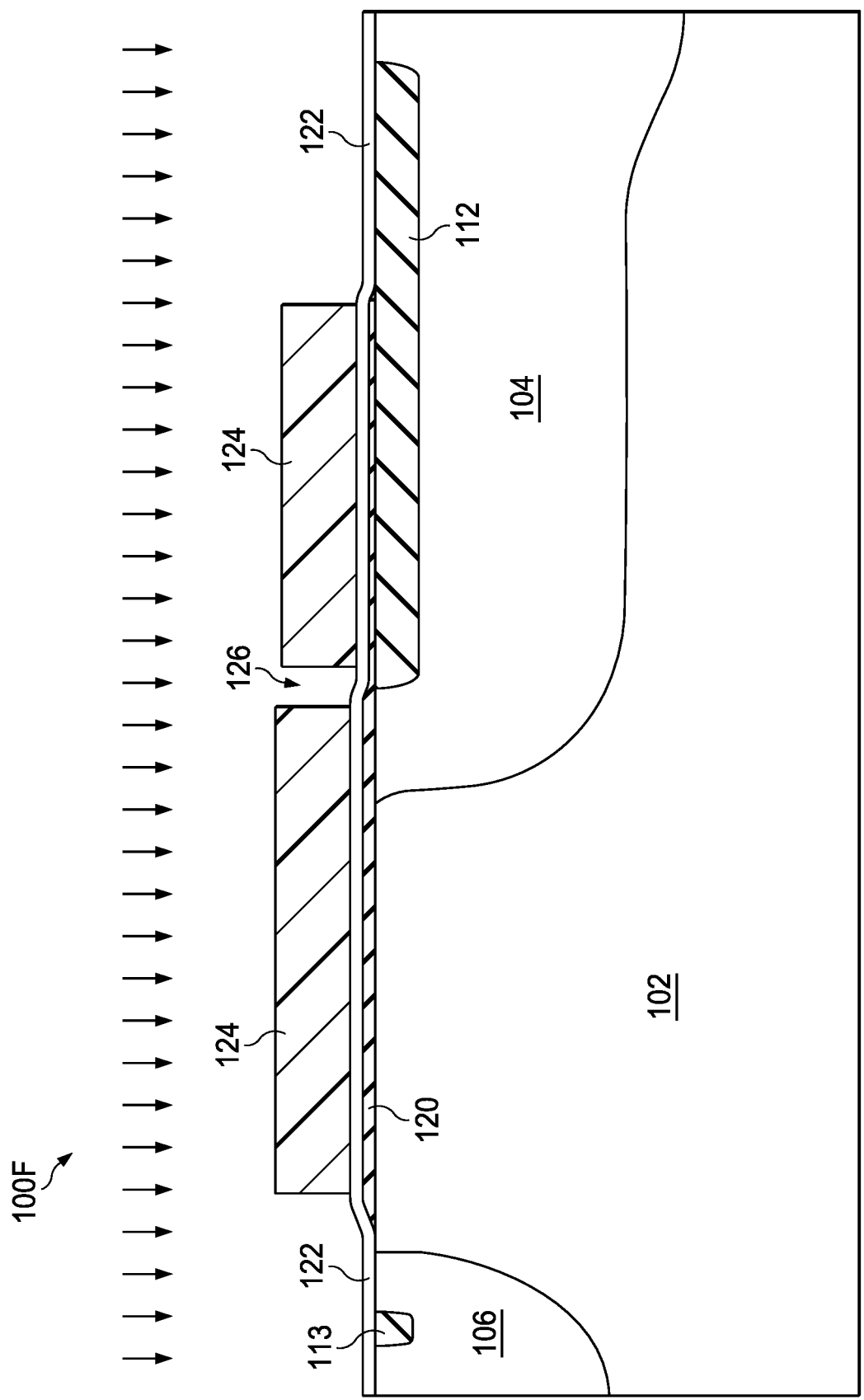
Figure 1G:
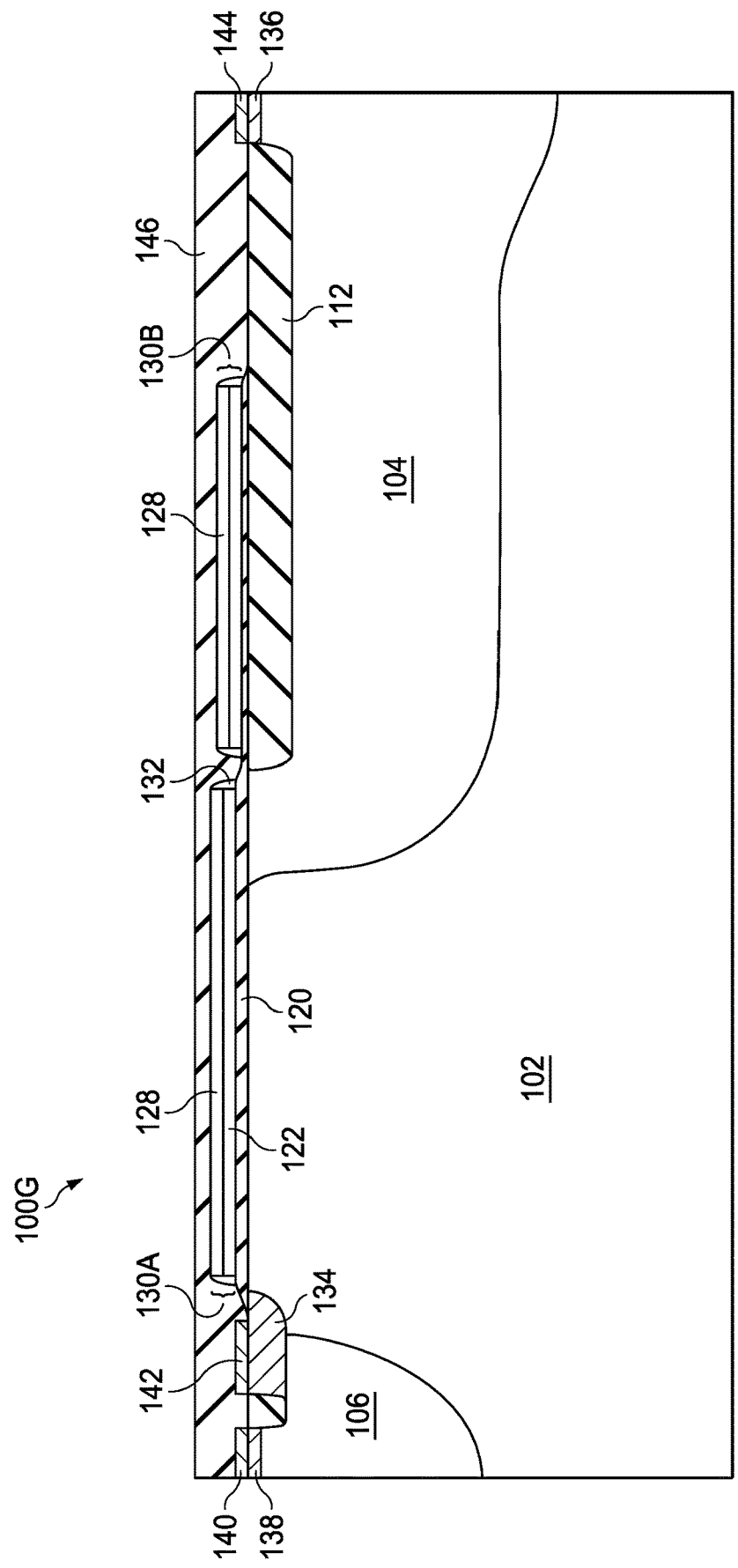

Once the gate oxide 120 has been grown, the silicon nitride 114 can be removed, e.g., by hot phosphoric acid, to prepare for formation of a conductive gate stack. In one embodiment, the conductive gate stack is formed of a polysilicon layer 122 with a silicide layer provided after the polysilicon layer 122 is etched. Polysilicon layer 122 can be formed using well-known fabrication techniques. In one embodiment, polysilicon layer 122 is polycrystalline silicon. However, it is within the scope of the invention to use other materials such as amorphous silicon, a silicon alloy (e.g. SiGe), or other suitable materials. A photoresist layer 124 is deposited and patterned to expose those regions of the wafer where the polysilicon is to be removed and to leave covered those regions where the gate is desired. In the embodiment shown, photoresist layer 124 overlies the gate region, except for a gap 126 that overlies the intersection of the gate oxide 120 with the edge of STI 112. FIG. 1F depicts the wafer 100F at the beginning of etching to remove undesirable portions of polysilicon layer 122. The improvements provided by gap 126 are explained with regard to FIGS. 2, 3 and 4.

When the fabrication of a DMOS transistor uses both a high-voltage gate oxide 120 and STI 112, the region immediately overlying the intersection of the gate oxide 120 with the edge of STI 112 can cause problems. An enlargement of cross-section 200 of this region is depicted in FIG. 2. In this figure, gate polysilicon 222 is separated from underlying silicon 202 by both HVGOX 220 and STI 212. Although HVGOX 220 has been grown to a thickness of 1200 Å, over the intersection of the HVGOX 220 and the edge of STI 212, the oxide is only 800 Å thick, due to the slower growth of the gate oxide over an existing oxide. This thinner region has caused problems with premature gate breakdown and has led to reluctance to utilize the combination of HVGOX and STI.

Figure 3:
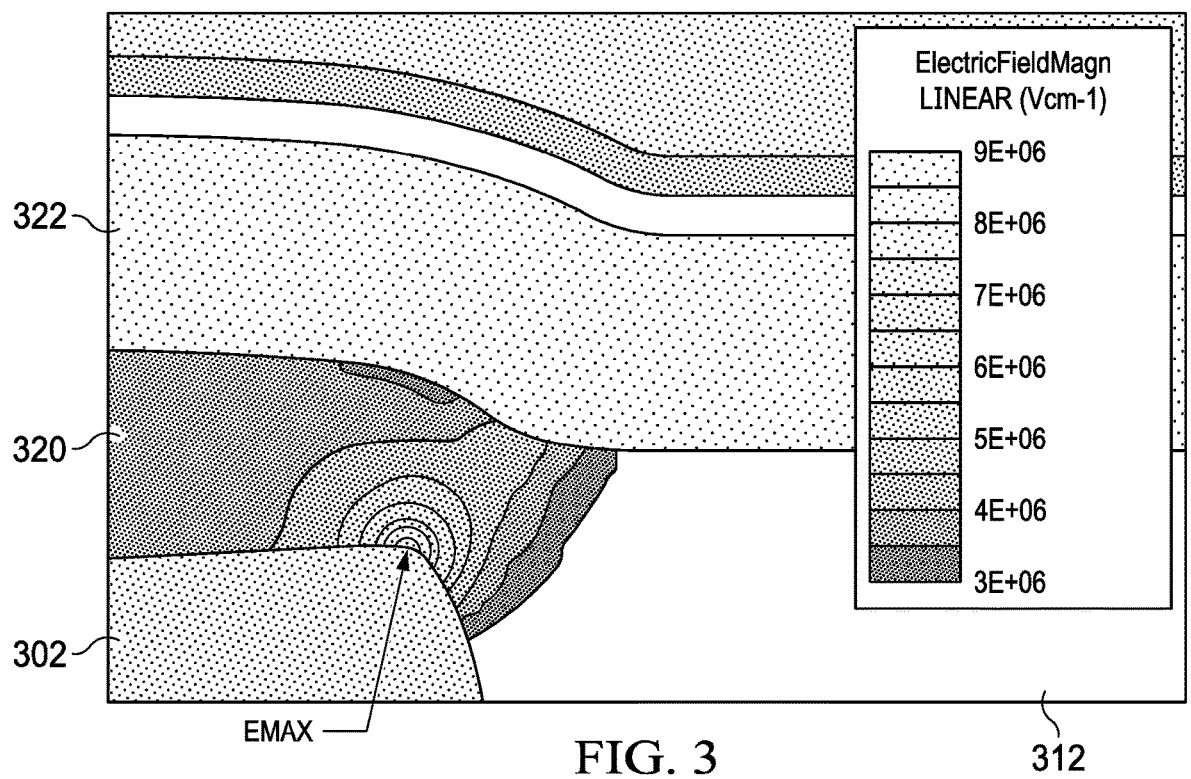
FIG. 3 depicts a diagram of the calculated electric field magnitude distribution in the oxide at the intersection of an edge of the STI with the thick gate oxide according to the prior art.

FIG. 3 shows a close-up of the intersection of HVGOX 320 and the edge of STI 312, with polysilicon gate 322 lying above the intersection and silicon 302 lying under the intersection. The figure also illustrates the calculated electric field magnitude distribution in HVGOX 320 and the region around the intersection for a DMOS transistor that does not contain the disclosed gap. For a gate voltage of 48V, the electric field in HVGOX 320 generally has a value of 4.0 e6 V/cm, although at the intersection of HVGOX 320 with the edge of STI 312, a maximum electric field (Emax) of 7.0 e6 V/cm is found in the oxide adjacent the corner of silicon 302, with an electric field of around 5.0 e6 V/cm extending through the oxide layer to the polysilicon gate 322. This high electric field at the intersection can cause known issues such as premature gate breakdown and poor reliability. It is for this reason that Applicant has introduced a gap in the polysilicon gate.

Returning to FIG. 1G, wafer 100G is shown at a point where the transistor has largely been completed. Where a gap 126 was provided in photoresist layer 124, the resultant gate stack 130 has been split into two separate gate stack portions 130A, 130B. In this embodiment, gate stack 130 includes portions of polysilicon layer 122 and a silicide layer 128. Sidewall spacers 132 have been formed on each portion of polysilicon layer 122. In one embodiment, the silicide layer 128 is formed using a self-aligned process in which a metal such as tungsten is deposited and annealed to react with exposed polysilicon. In other regions of wafer 100G, doping regions for a source 134, drain contact region 136 and backgate 138 have been implanted and a backgate contact 140, source contact 142 and drain contact 144 have been formed. Finally, a dielectric 146 has been deposited overlying the surface of the wafer.

Figure 4:
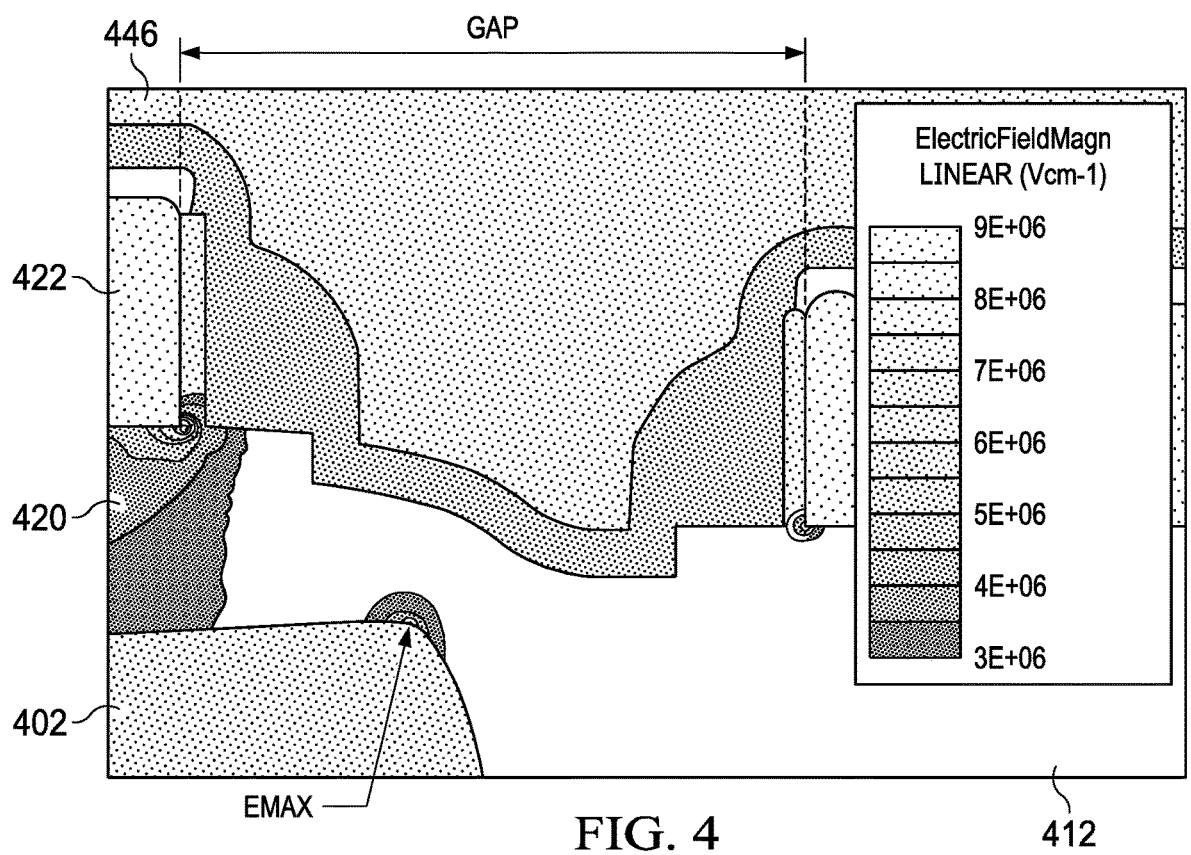
FIG. 4 depicts a diagram of the calculated electric field magnitude distribution in the oxide at the intersection of the edge of the STI and the thick gate oxide according to an embodiment of the disclosure.

FIG. 4 again shows a close-up of the intersection between an HVGOX 420 and the edge of STI 412, polysilicon gate 422 and silicon 402, but in a DMOS transistor in which the disclosed gap has been formed. The calculated electric field magnitude distribution in HVGOX 420 and in the region around the intersection is also shown. In this embodiment, it can be seen that the gap is filled with dielectric material from the sidewall spacers and an inter-level dielectric 446. Here, Emax at the intersection of HVGOX 420 with the edge of STI 412 is on the order of 4.0 e6 V/cm; this electric field does not extend to polysilicon gate 422. As shown by FIGS. 3 and 4, through the use of a gap in the gate stack, Emax in the oxide is reduced and allows the gate breakdown to be improved. Applicants note that two adjacent sections of a gate stack, e.g., 130A and 130B are generally connected together by a metallization layer. However, in one embodiment, the gate stack 130B is coupled to source 134 via source contact 142, which results in slightly lower gate capacitance at the expense of slightly higher Rsp.

Table 1 below depicts calculated dependencies of Rsp and Emax in the gate oxide versus the width of the gap in the gate stack for an 85V drain extended NMOS (DENMOS) transistor. For a wider gap in the gate stack, the Emax decreases, but the specific on-resistance increases. There is a "sweet spot" for which a 2-3 times reduction in Emax can be achieved with a reasonable increase in Rsp.

TABLE 1

| Gap µm | Rsp mOhm/cm2 | Emax MV/µm |
|---|---|---|
| 0 | 3.635 | 7 |
| 0.4 | 3.76 | 4 |
| 0.8 | 3.78 | 2.5 |
| 1.2 | 3.943 | 1.8 |
| 1.4 | 4.06 | 1.4 |
| 1.6 | 4.2 | 1.1 |

Figure 5:
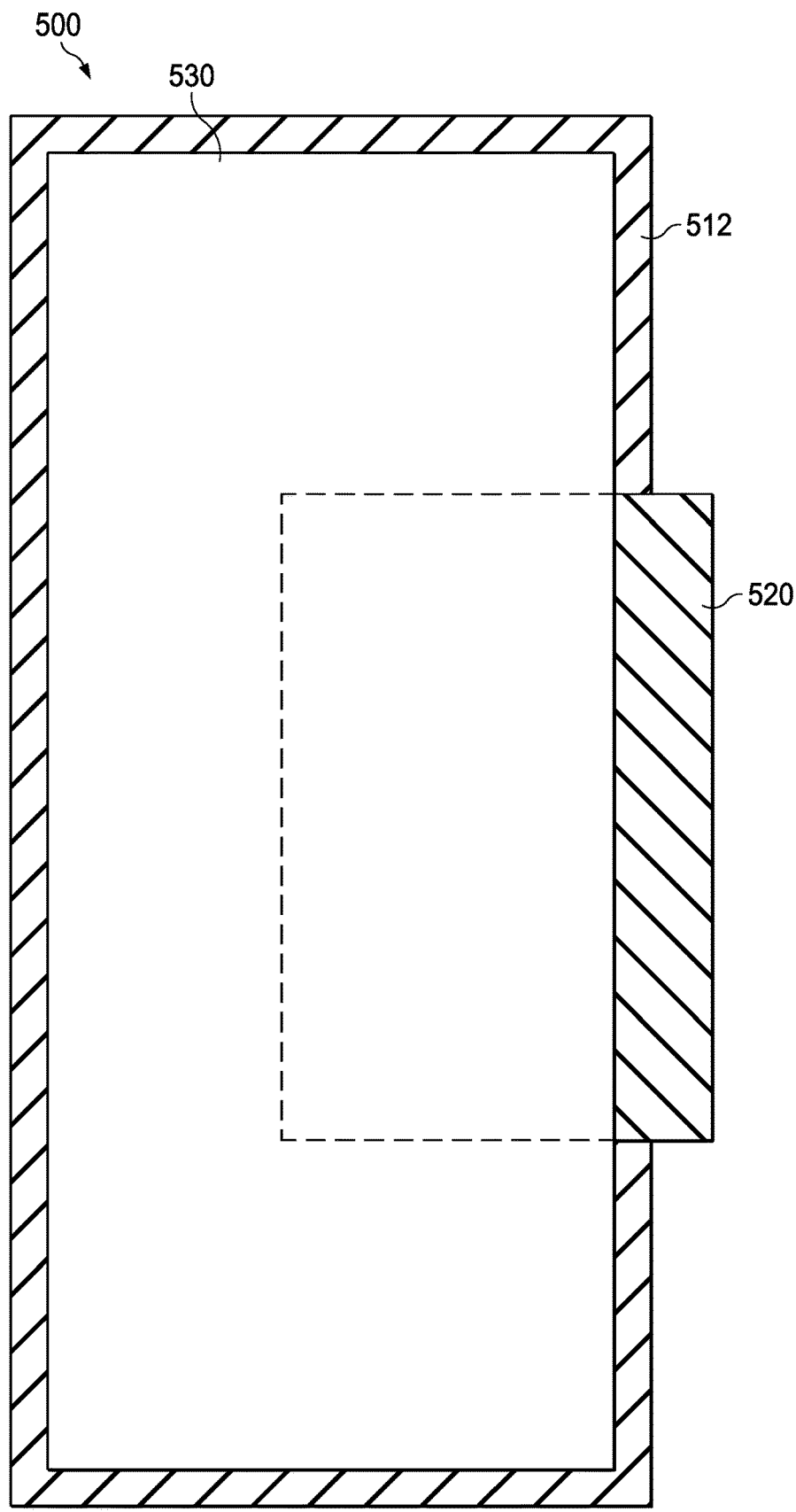
FIG. 5 depicts a layout of the gate stack, gate oxide and STI for a DMOS transistor according to the prior art.
Figure 6:
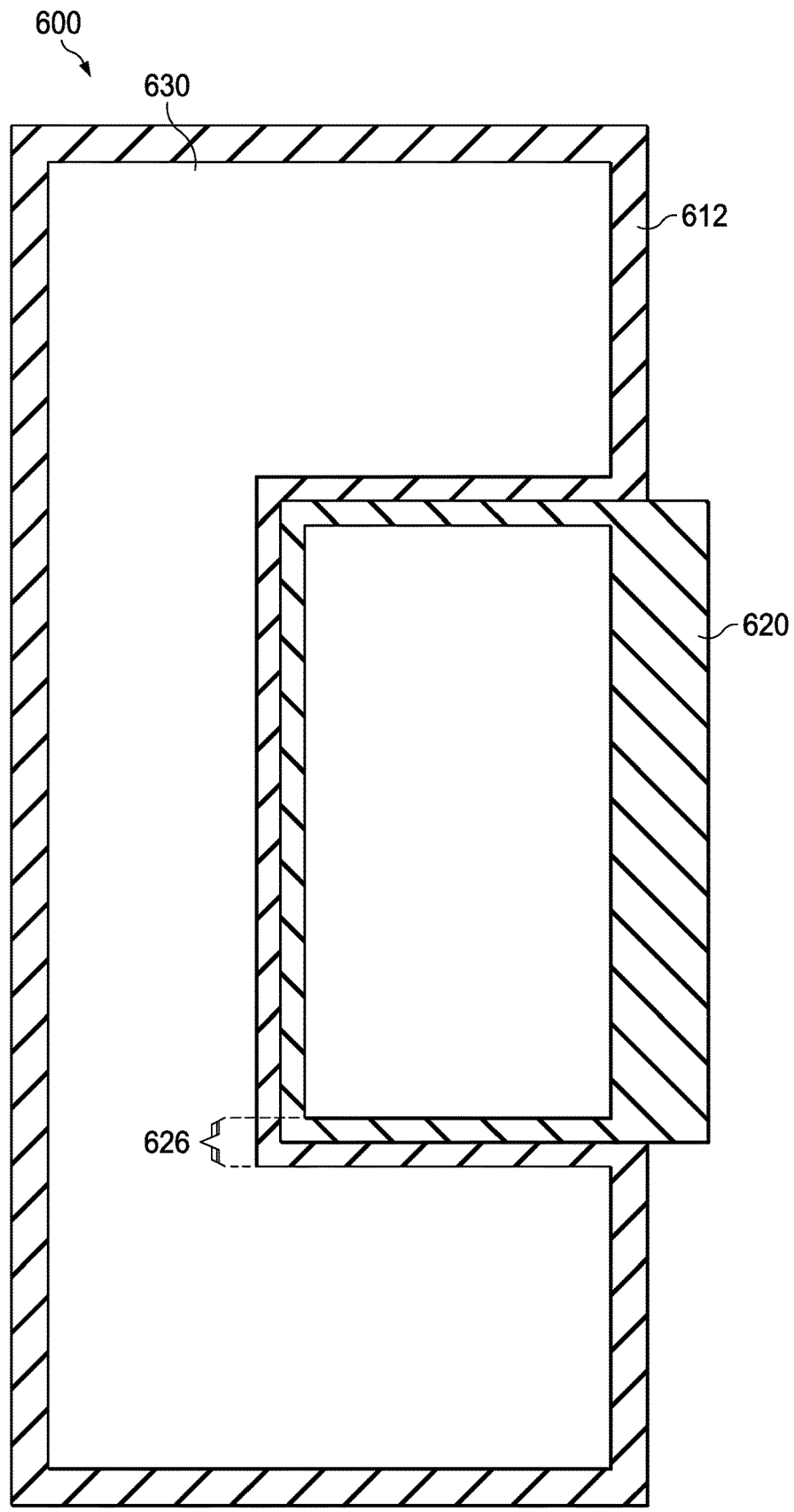
FIG. 6 depicts a layout of the gate stack, gate oxide and STI for a DMOS transistor according to an embodiment of the disclosure.

FIGS. 5 and 6 are provided to show how the introduction of the disclosed gap appears in a layout of the transistor, with layout 500 illustrating the gate stack 530, STI 512 and gate oxide 520 for a transistor in which no gap is provided. STI 512 is, of course, embedded in the silicon substrate of the wafer; gate oxide 520 is formed to partially overlie STI 512; and gate stack 530 overlies portions of each of gate oxide 520 and STI 512. FIG. 6 depicts the same layout, with gate stack 630, STI 612 and gate oxide 620, but with the addition of gap 626, which has been etched through gate stack 630 to expose portions of gate oxide 620 and STI 612. Layout 600 clearly demonstrates that gap 626 in the gate stack 630 follows the entire length of the intersection between gate oxide 620 with the edge of STI 612.

Figure 7:
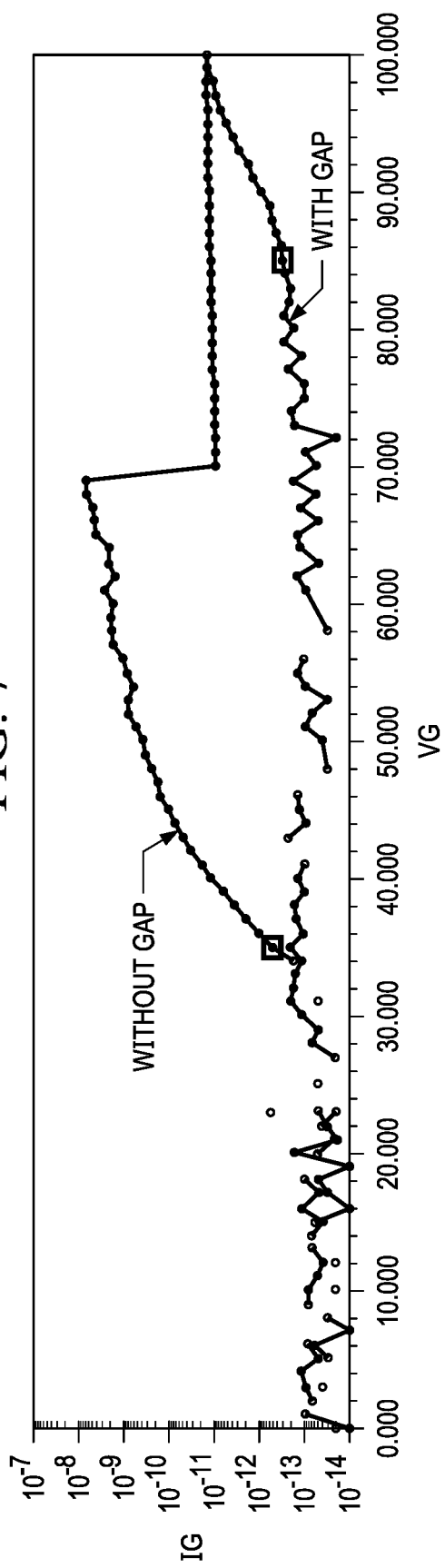
FIG. 7 depicts the measured gate current to gate voltage relationship for a DMOS transistor with and without the disclosed gap.

FIG. 7 depicts the measured gate current to gate voltage, i.e., Igate/Vgate, dependence for a DENMOS transistor with 48V gate oxide and STI between source and drain moats. A first transistor had no gap, while a second transistor had a gap with a width of 0.6 um. At voltages up to about 34V, the two transistors gave fairly similar results. However, starting at about 35V, the transistor that had no gap began to exhibit a quickly increasing current as the voltage rose. This trend continued until around 72V, at which point this particular transistor experienced a catastrophic failure, causing the gate current to drop to a steady current. In contrast, the transistor having a gap in the gate stack was able to operate much longer, i.e., until almost 90V before starting to rise. Even without the catastrophic failure experienced by this transistor, the improved operation of the transistor containing the gap in the gate is clear.

Figure 8:
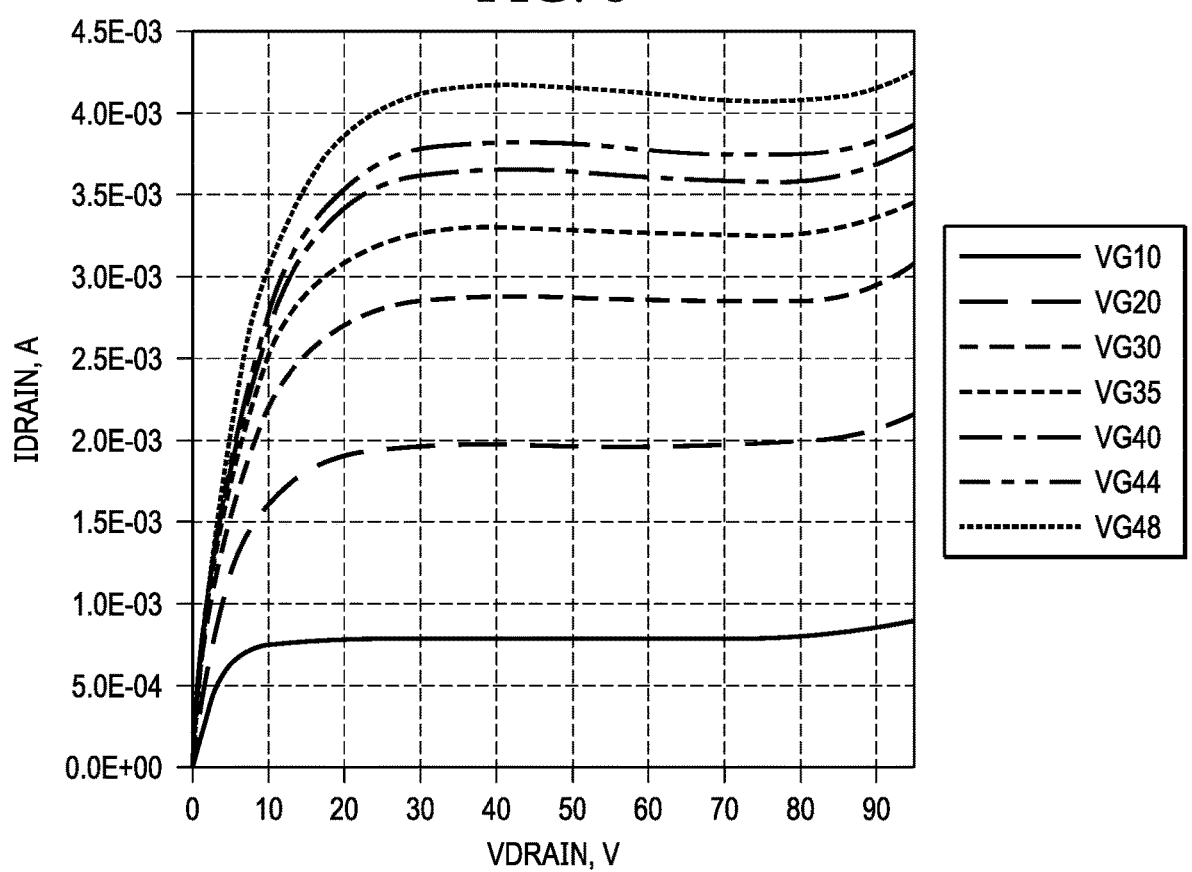
FIG. 8 depicts the measured drain current to drain voltage relationship for DMOS transistors designed for different gate voltages according to an embodiment of the disclosure.

FIG. 8 depicts the measured drain current to drain voltage relationship for transistors designed for gate voltages of 10V, 20V, 30V, 34V, 40V, 44V and 48V. The measured I-V curves exhibit nearly square SOA, demonstrating that the combination of STI and a drift region in the drain extension region, coupled with a gap in the gate stack may result in significantly better SOA of DMOS with a thick gate oxide.

Figure 9:
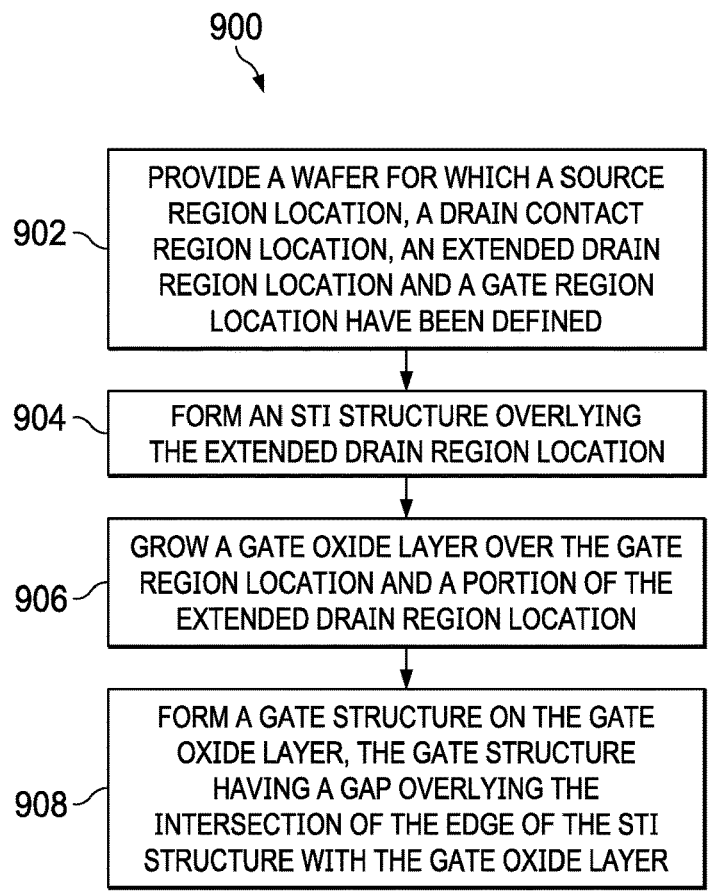
FIG. 9 depicts a flowchart for fabricating an IC chip containing a DMOS transistor according to an embodiment of the disclosure.

FIG. 9 depicts a flowchart of a method 900 of fabricating an IC chip that includes a DMOS transistor according to an embodiment of the disclosure. Method 900 provides a high-level view of the actions to form the DMOS transistor that combines a thick gate oxide with STI over the extended drain and that has a gap in the gate stack overlying the intersection of the thick gate oxide with the edge of the STI. FIGS. 9A-9F will be discussed below to provide more details of these actions. The method 900 begins with providing 902 a wafer for which a source region location, a drain contact region location, an extended drain region location and a gate region location have been defined. In one embodiment, the extended drain region will have been fabricated early in the process. In one embodiment, the extended drain region is fabricated after formation of the STI and prior to forming the gate stack. The method then forms 904 an STI structure overlying the extended drain region location. The method then grows 906 a gate oxide layer over the gate region location and a portion of the extended drain region location. Finally, the method forms 908 a gate structure on the gate oxide layer, the gate structure having a gap overlying the intersection of the edge of the STI structure with the gate oxide layer.

Figure 9A:
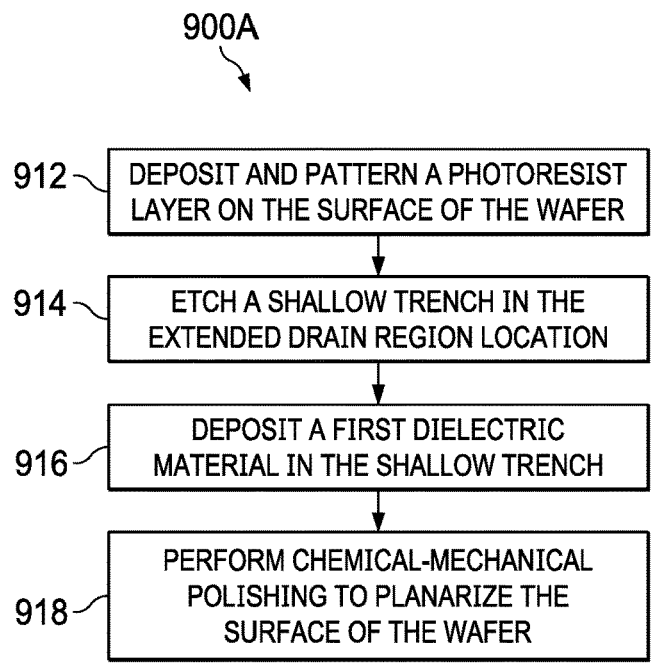

FIG. 9A depicts one embodiment of a method 900A of forming the STI structure of step 904 in FIG. 9. The method includes depositing and patterning 912 a photoresist layer on the surface of the wafer. The patterning is designed to expose those regions of the wafer on which the STI structures are desired. The method continues with etching 914 a shallow trench in the exposed regions, which includes at least the extended drain region of the DMOS transistor. Once the etching is completed and remaining traces of the photoresist layer are removed, the method continues by depositing 916 a dielectric material in the shallow trenches and performing 918 CMP to planarize the surface of the wafer after deposition of the dielectric material. In one embodiment, the dielectric material is silicon dioxide, which overfills the trenches; the CMP removes excess dielectric material on the surface of the wafer.

Figure 9B:
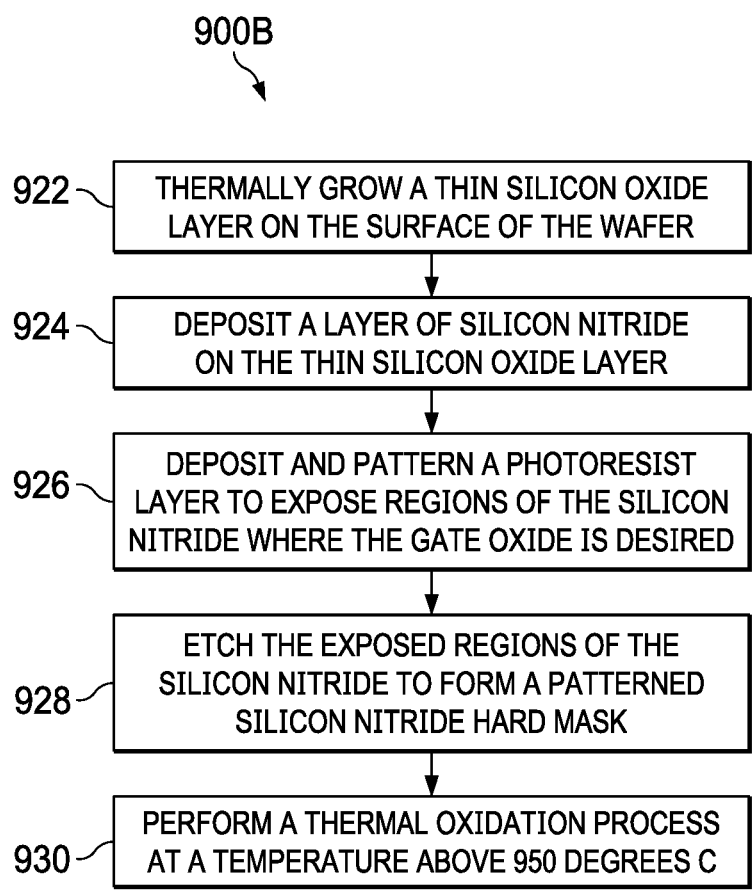
Figure 9C:
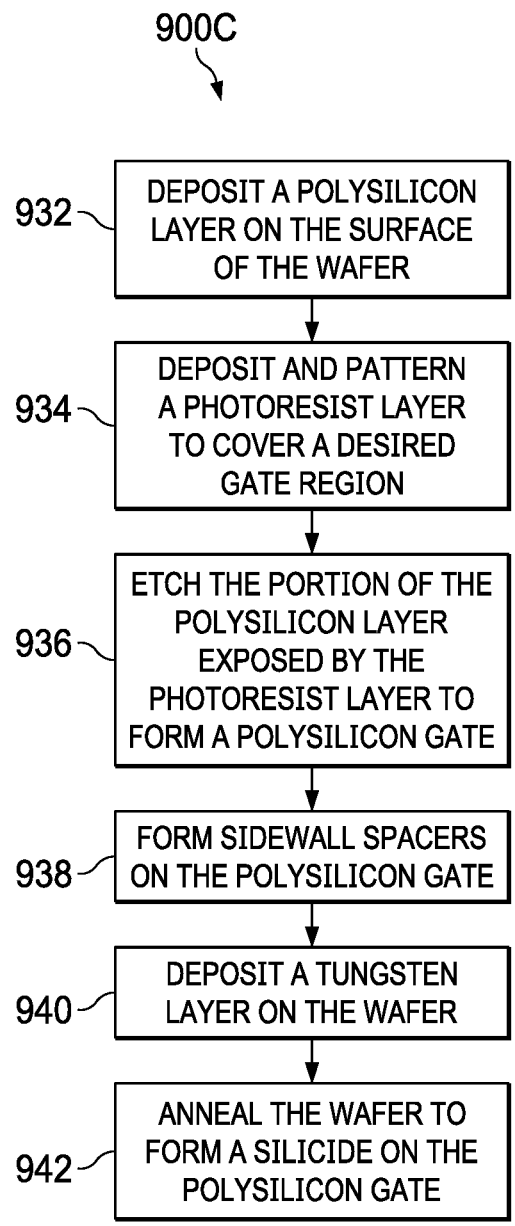

FIG. 9B depicts one embodiment of a method 900B for growing the gate oxide of step 906 in FIG. 9. Method 900B includes thermally growing 922 a thin silicon oxide layer on the surface of the wafer to provide a pad oxide, and depositing 924 a layer of silicon nitride on the thin silicon oxide layer. The method continues with depositing and patterning 926 a photoresist layer to expose regions of the silicon nitride where the gate oxide is desired. Method 900B continues with etching 928 the silicon nitride exposed by the photoresist layer with any suitable etching process, e.g., using a plasma of a fluorine containing gas, which exhibits good selectivity to the underlying silicon oxide, to form a patterned silicon nitride hard mask and performing 930 a thermal oxidation process at a temperature above 950 degrees C. In one embodiment, the thermal oxidation process is a steam oxidation process FIG. 9C depicts one embodiment of a method 900C for forming the gate structure of step 908 in FIG. 9. Method 900C includes depositing 932 a polysilicon layer on the surface of the wafer. In one embodiment, the polysilicon layer is deposited using chemical vapor deposition. The method then deposits and patterns 934 a photoresist layer; the photoresist layer is patterned to cover the desired gate region, except for the region overlying the intersection of the gate oxide with the edge of the STI, which is exposed. The method continues with etching 936 the exposed portions of the polysilicon to form the polysilicon gate, which includes a gap overlying the previously mentioned intersection. In one embodiment, sidewall spacers are formed 938 on the polysilicon gate using, for example, silicon nitride. In one embodiment, a layer of metal such as tungsten is deposited 940 on the wafer and the wafer is annealed 942 to form a silicide on exposed top surface of the polysilicon gate. Unreacted tungsten can then be removed from the wafer, providing a self-aligned silicide.

Applicants have demonstrated that, in DMOS transistors having a thick gate oxide over the channel region and STI between source and drain moats, a gap in the gate stack that overlies the intersection of the gate oxide with the edge of the STI may lower the maximum electric field in the dielectric over the intersection and serve to avoid premature gate breakdown. This improvement can be made without requiring an additional mask in the process.

Other elements of fabricating the DMOS transistor are shown in the remaining figures. In method 900D, the extended drain region is doped 946. This can be performed prior to the actions shown in FIG. 9, e.g., as part of growing an epitaxial layer on the substrate, or can occur after the STI has been formed, e.g., by implantation. Method 900E implants 948 dopants in the source regions and the drain contact region of the DMOS transistor and is generally performed after the actions of method 900. Finally, method 900F deposits 950 a second dielectric layer that overlies the surface of the wafer. This dielectric layer is provided after all regions in the substrate have been completed and prior to the beginning of depositing metallization layers.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit (IC) chip having a double-diffused metal oxide silicon (DMOS) transistor, the transistor comprising:
    a source region having a first dopant type;
    an extended drain region coupled to a drain contact region, the extended drain region and the drain contact region having the first dopant type;
    a gate region having a second dopant type that is opposite the first dopant type;
    a shallow trench isolation (STI) structure overlying the extended drain region;
    a gate oxide layer overlying the gate region and a portion of the extended drain region;
    a gate structure on the gate oxide layer, the gate structure having a gap overlying an intersection of an edge of the STI structure with the gate oxide layer, the gap filled with a dielectric; and
    a sidewall spacer on a sidewall surface of the gate structure within the gap between the dielectric and the sidewall surface.

2. The IC chip as recited in claim 1 wherein the gate oxide layer has a thickness that is at least five percent of the thickness of the STI structure.

3. An integrated circuit (IC) chip having a double-diffused metal oxide silicon (DMOS) transistor, the transistor comprising:
    a source region having a first dopant type;
    an extended drain region coupled to a drain contact region, the extended drain region and the drain contact region having the first dopant type;
    a gate region having a second dopant type that is opposite the first dopant type;
    a shallow trench isolation (STI) structure overlying the extended drain region;
    a gate oxide layer overlying the gate region and a portion of the extended drain region; and
    a gate structure on the gate oxide layer, the gate structure having a gap, having a width of between 0.4 and 1.0 microns, overlying an intersection of an edge of the STI structure with the gate oxide layer, the gap filled with a dielectric.

4. The IC chip as recited in claim 3 wherein the gate structure comprises a polysilicon layer.

5. The IC chip as recited in claim 4 wherein the gate structure further comprises dielectric sidewall spacers.

6. The IC chip as recited in claim 5 wherein the gate structure further comprises a silicide layer on the polysilicon layer.

7. The IC chip as recited in claim 6 further comprising an inter-level dielectric (ILD) material overlying the source region, the extended drain region, the drain contact region, the gate region, the STI structure, the gate oxide layer and the gate structure, the ILD material filling the gap.

8. An integrated circuit (IC), comprising:
   a source region having a first conductivity type located over a semiconductor layer having a second opposite conductivity type;
   a drain region and a drain contact region within the drain region, the drain region and the drain contact region located over the semiconductor layer and having the first conductivity type;
   a gate structure having a nonlinear bottom surface overlying the semiconductor layer and having a dielectric filled gap over the drain region; and
   a shallow trench isolation (STI) structure overlying the drain region and having an interface with the drain region that intersects a top surface of the semiconductor layer under the gap.

9. The IC as recited in claim 8, further comprising a gate oxide layer between the top surface and the gate structure, the gate oxide layer having a thickness that is at least five percent of a thickness of the STI structure.

10. An integrated circuit (IC), comprising:
    a source region having a first conductivity type located over a semiconductor layer having a second opposite conductivity type;
    a drain region and a drain contact region within the drain region, the drain region and the drain contact region located over the semiconductor layer and having the first conductivity type;
    a gate structure overlying the semiconductor layer and having a dielectric filled gap, having a width of between 0.4 and 1.0 microns, over the drain region; and
    a shallow trench isolation (STI) structure overlying the drain region and having an interface with the drain region that intersects a top surface of the semiconductor layer under the gap.

11. The IC as recited in claim 8 wherein the gate structure comprises polysilicon.

12. The IC as recited in claim 11 wherein the gate structure further comprises a silicide layer on the polysilicon layer.

13. The IC as recited in claim 8 wherein the gate structure further comprises dielectric sidewall spacers.

14. The IC as recited in claim 8, further comprising an inter-level dielectric material overlying the semiconductor layer and, the inter-level dielectric material filling the gap.

15. A transistor, comprising:
    a source region and a drain region both having a first conductivity type and located over a semiconductor layer having a second opposite conductivity type;
    a gate structure having a nonlinear bottom surface that overlies the drain region and extends to the source region, the gate structure having a dielectric filled gap over the drain region; and
    a shallow trench isolation (STI) structure overlying the drain region and having an interface with the drain region that intersects a top surface of the semiconductor layer under the gap.

16. The transistor as recited in claim 15, further comprising an inter-level dielectric material overlying the substrate, the inter-level dielectric material filling the gap.

17. The transistor as recited in claim 15, wherein the transistor is a double-diffused metal oxide silicon (DMOS) transistor, and the drain region is an extended drain region that extends from a drain contact toward the source region.

18. The transistor as recited in claim 15, wherein the first conductivity type is n-type and the second conductivity type is p-type.

19. The IC as recited in claim 8, wherein the semiconductor layer is a substrate.

20. The IC as recited in claim 8, wherein a silicide layer is formed on the gate structure but not on the source region.

21. The IC as recited in claim 8, wherein a silicide layer is formed on the gate structure but not on the drain region.

22. The transistor as recited in claim 15, wherein the semiconductor layer is a substrate.

23. The transistor as recited in claim 15, wherein a silicide layer is formed on the gate structure but not on the source region.

24. The transistor as recited in claim 15, wherein a silicide layer is formed on the gate structure but not on the drain region.

25. An integrated circuit (IC) chip having a double-diffused metal oxide silicon (DMOS) transistor, the transistor comprising:
    a source region having a first dopant type;
    an extended drain region coupled to a drain contact region, the extended drain region and the drain contact region having the first dopant type;
    a gate region having a second dopant type that is opposite the first dopant type;
    a shallow trench isolation (STI) structure overlying the extended drain region;
    a gate oxide layer overlying the gate region and a portion of the extended drain region; and
    a gate structure entirely on the gate oxide layer, the gate structure having a gap overlying an intersection of an edge of the STI structure with the gate oxide layer, the gap filled with a dielectric.

26. An integrated circuit (IC) chip having a double-diffused metal oxide silicon (DMOS) transistor, the transistor comprising:
    a source region having a first dopant type;
    an extended drain region coupled to a drain contact region, the extended drain region and the drain contact region having the first dopant type;
    a gate region having a second dopant type that is opposite the first dopant type;
    a shallow trench isolation (STI) structure overlying the extended drain region;
    a gate oxide layer overlying the gate region and a portion of the extended drain region; and
    a gate structure on the gate oxide layer, the gate structure having a gap overlying an intersection of an edge of the STI structure with the gate oxide layer, the gap filled with a dielectric, a surface of the gate oxide layer being nonlinear beneath the gap.

27. An integrated circuit (IC) chip having a double-diffused metal oxide silicon (DMOS) transistor, the transistor comprising:

a source region having a first dopant type;

an extended drain region coupled to a drain contact region, the extended drain region and the drain contact region having the first dopant type;

a gate region having a second dopant type that is opposite the first dopant type;

a shallow trench isolation (STI) structure overlying the extended drain region;

a gate oxide layer overlying the gate region, a portion of the extended drain region and no portion of the source region; and a gate structure on the gate oxide layer, the gate structure having a gap overlying an intersection of an edge of the STI structure with the gate oxide layer, the gap filled with a dielectric.

28. An integrated circuit (IC), comprising:

a source region having a first conductivity type located over a semiconductor layer having a second opposite conductivity type;

a drain region and a drain contact region within the drain region, the drain region and the drain contact region located over the semiconductor layer and having the first conductivity type;

a gate structure overlying the semiconductor layer and having a dielectric filled gap over the drain region; and a nonlinear shallow trench isolation (STI) structure overlying the drain region and having an interface with the drain region that intersects a top surface of the semiconductor layer under the gap.

29. A transistor, comprising:

a source region and a drain region both having a first conductivity type and located over a semiconductor layer having a second opposite conductivity type;

a gate structure that overlies the drain region and extends to the source region, the gate structure having a dielectric filled gap over the drain region; and a nonlinear shallow trench isolation (STI) structure overlying the drain region and having an interface with the drain region that intersects a top surface of the semiconductor layer under the gap.

* * * * *